(12) United States Patent
Alvarado et al.

(10) Patent No.: US 9,099,345 B2
(45) Date of Patent: Aug. 4, 2015

(54) ENHANCED WLP FOR SUPERIOR TEMP CYCLING, DROP TEST AND HIGH CURRENT APPLICATIONS

(75) Inventors: Rey Alvarado, San Jose, CA (US); Tie Wang, Sunnyvale, CA (US); Arkadii Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/608,555

(22) Filed: Sep. 10, 2012

(65) Prior Publication Data

US 2012/0326308 A1    Dec. 27, 2012

Related U.S. Application Data

(63) Continuation of application No. 12/725,967, filed on Mar. 17, 2010, now Pat. No. 8,264,089.

(51) Int. Cl.
*H01L 23/48* (2006.01)
*H01L 23/52* (2006.01)
(Continued)

(52) U.S. Cl.
CPC ............... *H01L 24/11* (2013.01); *H01L 24/03* (2013.01); *H01L 24/05* (2013.01); *H01L 24/13* (2013.01); *H01L 23/3114* (2013.01); *H01L 23/3192* (2013.01); *H01L 2224/0345* (2013.01); *H01L 2224/0361* (2013.01); *H01L 2224/03462* (2013.01); *H01L 2224/03602* (2013.01); *H01L 2224/0401* (2013.01); *H01L 2224/05005* (2013.01); *H01L 2224/056* (2013.01); *H01L 2224/05016* (2013.01); *H01L 2224/05017* (2013.01); *H01L 2224/05024* (2013.01); *H01L 2224/05073* (2013.01); *H01L 2224/05082* (2013.01); *H01L 2224/05147* (2013.01); *H01L 2224/05155* (2013.01); *H01L 2224/05541* (2013.01); *H01L 2224/05559* (2013.01); *H01L 2224/05572* (2013.01); *H01L 2224/05611* (2013.01); *H01L 2224/05639* (2013.01); *H01L 2224/05644* (2013.01); *H01L 2224/05655* (2013.01); *H01L 2224/05664* (2013.01); *H01L 2224/05684* (2013.01); *H01L 2224/11424* (2013.01); *H01L 2224/11602* (2013.01); *H01L 2224/11849* (2013.01); *H01L 2224/131* (2013.01); *H01L 2224/13006* (2013.01); *H01L 2224/13017* (2013.01); *H01L 2224/13022* (2013.01); *H01L 2224/13023* (2013.01); *H01L 2224/13026* (2013.01); *H01L 2224/13082* (2013.01); *H01L 2224/94* (2013.01); *H01L 2924/0002* (2013.01); *H01L 2924/00014* (2013.01); *H01L 2924/014* (2013.01); *H01L 2924/01005* (2013.01); *H01L 2924/0105* (2013.01); *H01L 2924/01029* (2013.01); *H01L 2924/01033* (2013.01); *H01L 2924/01047* (2013.01); *H01L 2924/01074* (2013.01);
(Continued)

(58) Field of Classification Search
CPC .......... H01L 24/11; H01L 24/03; H01L 24/05
USPC .................................................. 257/738, 778
See application file for complete search history.

(56) References Cited

U.S. PATENT DOCUMENTS 5,523,920 A * 6/1996 Machuga et al. ............. 361/767
5,641,113 A * 6/1997 Somaki et al. ........... 228/180.22
(Continued)

*Primary Examiner* — David S Blum
(74) *Attorney, Agent, or Firm* — Advent, LLP

(57) ABSTRACT

A WLP device is provided with a flange shaped UBM or an embedded partial solder ball UBM on top of a copper post style circuit connection.

5 Claims, 3 Drawing Sheets

(51) Int. Cl.
  *H01L 29/40* (2006.01)
  *H01L 23/00* (2006.01)
  *H01L 23/31* (2006.01)

(52) U.S. Cl.
  CPC ............... *H01L2924/01079* (2013.01); *H01L 2924/01327* (2013.01); *H01L 2924/10253* (2013.01)

(56) References Cited

U.S. PATENT DOCUMENTS

| | | | |
|---|---|---|---|
| 5,973,394 A * | 10/1999 | Slocum et al. | 257/690 |
| 6,046,071 A * | 4/2000 | Sawai et al. | 438/106 |
| 6,103,552 A | 8/2000 | Lin | |
| 6,326,701 B1 * | 12/2001 | Shinogi et al. | 257/797 |
| 6,372,619 B1 * | 4/2002 | Huang et al. | 438/597 |
| 6,479,900 B1 * | 11/2002 | Shinogi et al. | 257/758 |
| 6,492,600 B1 * | 12/2002 | Jimarez et al. | 174/262 |
| 6,653,218 B2 * | 11/2003 | Ohuchi et al. | 438/613 |
| 6,780,746 B2 * | 8/2004 | Kinsman et al. | 438/612 |
| 6,930,032 B2 * | 8/2005 | Sarihan et al. | 438/614 |
| 7,294,933 B2 | 11/2007 | Hanaoka | |
| 7,358,618 B2 | 4/2008 | Shibata | |
| 7,459,343 B2 * | 12/2008 | Yamano | 438/114 |
| 7,476,980 B2 | 1/2009 | Rebibis et al. | |
| 7,485,973 B2 * | 2/2009 | Hashimoto | 257/784 |
| 7,683,482 B2 | 3/2010 | Nishida et al. | |
| 7,977,160 B2 | 7/2011 | Su et al. | |
| 8,264,089 B2 * | 9/2012 | Alvarado et al. | 257/778 |
| 2002/0167085 A1 | 11/2002 | Ohuchi et al. | |
| 2003/0057568 A1 | 3/2003 | Miyazaki | |
| 2003/0071354 A1 | 4/2003 | Tsai et al. | |
| 2004/0207082 A1 | 10/2004 | Yamano et al. | |
| 2004/0207088 A1 | 10/2004 | Morozumi | |
| 2005/0006748 A1 | 1/2005 | Eng et al. | |
| 2005/0112800 A1 | 5/2005 | Yamano | |
| 2005/0173809 A1 * | 8/2005 | Yamamoto et al. | 257/780 |
| 2006/0166402 A1 | 7/2006 | Lim et al. | |
| 2007/0023924 A1 | 2/2007 | Funaki | |
| 2008/0268572 A1 | 10/2008 | Shen et al. | |
| 2009/0096092 A1 | 4/2009 | Patel | |
| 2009/0127718 A1 * | 5/2009 | Chen | 257/778 |
| 2009/0130840 A1 * | 5/2009 | Wang et al. | 438/614 |
| 2009/0224409 A1 * | 9/2009 | Miyata et al. | 257/774 |
| 2010/0320588 A1 * | 12/2010 | Dahilig et al. | 257/690 |

* cited by examiner

ENHANCED WLP FOR SUPERIOR TEMP CYCLING, DROP TEST AND HIGH CURRENT APPLICATIONS

CROSS-REFERENCE TO RELATED APPLICATIONS

This application is a Continuation under 35 U.S.C. §120 of U.S. patent application Ser. No. 12/725,967, now U.S. Pat. No. 8,246,089, filed Mar. 17, 2010, entitled "ENHANCED WLP FOR SUPERIOR TEMP CYCLING, DROP TEST AND HIGH CURRENT APPLICATIONS," which application is hereby incorporated by reference in its entirety.

TECHNICAL FIELD

This application relates to Wafer Level Packaging (WLP) and its design such that improved temperature cycling, drop test performance and high current applications can be utilized in a WLP package. More particularly, embodiments of the invention provide a WLP with a flanged Under Ball Metal (UBM) configuration on a top surface of a copper post style electrical connection that provides a three dimensional solder ball interface.

BACKGROUND

FIG. 1 depicts a prior art configuration of a WLP copper post-solder ball configuration 100. This prior art WLP configuration 100 comprises a silicon layer 102, which is shown as a portion of a silicon wafer used in the manufacture of integrated circuits. A copper post 104 is connected or electrically bonded to an RDL layer (not specifically shown), which exists between the circuitry of the silicon wafer 102 and the copper post 104. The copper post 104 is used for connecting a circuit on the prior art WLP configuration 100 to a solder ball 108. The solder ball 108 is for electrically and metallurgically connecting the WLP or wafer level package to, for example, a circuit board (not shown).

During the manufacture of a prior art WLP configuration 100, an etching process is used on the copper post 104 which results in the surface 110 of the copper post being embedded or inset 5 to 20 microns below the surface of the epoxy or encapsulant 106, which surrounds the copper post. When the solder ball 108 is reflowed and thereby metallurgically attached to the surface 110 of the copper post 104, an interface between the solder ball 108, the epoxy 106 and the copper post 104 is created, which is shown as the ball/post/epoxy mechanical interface 112. Due to the topology of the ball/post/epoxy mechanical interface 112, wherein a sharp corner of the encapsulant is always in contact with the solder ball 108, drop testing and temperature cycle testing of a prior art WLP part result in WLP part failure that tends to occur at the ball/post/epoxy mechanical interface 112. One of the causes of the failure may be due to expansion and contraction of the encapsulant and the solder ball during a drop test impulse shock or during the heating/cooling cycles of a temperature test. Another possible cause of the failure may originate with the ball/post/epoxy mechanical interface 112 wherein the epoxy transfers heat to the solder ball thereby creating compression and tension stresses thereabout during thermo-mechanical testing and/or field use.

As such, what is needed is a more robust copper post-to-solder ball interface that provides a strong mechanical metallic bond between the metals and provides a level of reliability that consistently passes temperature cycling tests, drop tests and high current tests.

SUMMARY

An embodiment of the invention provides a wafer level package (WLP) solder bump structure that comprises a copper pillar which extends perpendicularly a first distance away from a fabricated WLP silicon surface. The copper pillar comprises pillar sides that are substantially cylindrical along with a distal portion that is distal from the fabricated WLP silicon surface. The distal portion comprises a copper surface. The exemplary WLP solder bump structure further includes a first encapsulant that is about the pillar sides and substantially covers the fabricated WLP silicon surface. The copper surface at the distal portion of the copper pillar is recessed a small recessed distance below the first encapsulant's outer surface such that the recessed area is above the copper surface. Bonded to the copper surface is an under ball metal (UBM). The UBM comprises a first portion that is within the recessed area and a second portion that is above the recessed area and overlaps the encapsulant's outer surface about the recessed area.

In some embodiments of the invention, the UBM comprises nickel (Ni).

Another embodiment of the invention is a wafer level package (WLP) that comprises a fabricated silicon layer having a circuit for active side. On the circular active side of the fabricated silicon layer, a circuit connection location may be found. A copper pillar, having a length from the first end to a second end thereof and a first width or diameter, is metallurgically bonded at its first end to the circuit connection location. The wafer level package further comprises an under ball metallurgy (UBM) layer. The UBM layer has a neck end or narrow end, which has substantially the same width or diameter as the copper pillar. The UBM further comprises a flange end having a second width or diameter along with an edge thickness. The neck end is centered with the flange end and the neck end is further centered and set against or metallurgically bonded with the second end of the copper pillar. The width or diameter of the copper pillar and neck end is smaller than the width or diameter of the flange end. The WLP further comprises an encapsulant layer about the copper pillar and substantially covering the circuit side of the fabricated silicon layer. The encapsulant has a thickness that extends from the circuit side of the fabricated silicon layer toward the flange end of the UBM. The exemplary WLP may further comprise a solder ball set on and about the flange end and a flange end edge.

In some embodiments, the WLP may include a metal layer between the second end of the copper pillar and the neck end of the UBM.

In yet an additional embodiment, a WLP is provided that comprises a WLP die that has a circuit side. A copper post is attached at a first end of the copper post to a WLP circuit connection, which is located on the circuit side of the WLP die. The copper post has a width or diameter and a post length that extends from a first post end to a second post end. A first metal layer, comprising a flared or flanged portion such that it has a narrow end and a wide end is included in the exemplary WLP package such that the narrow end is set to and aligned with the second post end of the copper post. A first encapsulant layer substantially covers the circuit side of the WLP die and has a thickness such that the first encapsulant layer is about the copper posts and a portion of the narrow end of the first metal layer such that the wide, flared or flanged end extends over the first encapsulant layer. A solder ball is attached to the wide, flared, flanged end of the first metal layer.

In additional embodiments, the WLP may further comprise a second encapsulant layer, on top of the first encapsulant layer, and about the first metal layer such that the first metal layer is embedded in the second encapsulant layer. The top surface of the second encapsulant layer is substantially coplanar with the top surface of what would have been or what is the wide end of the first metal layer. In this embodiment, the solder ball is attached to the top side of the wide end of the first metal layer. In some embodiments, the first encapsulant and the second encapsulant are the same compounds. Furthermore, in other embodiments, the first metal layer and the solder ball are both made substantially of tin.

BRIEF DESCRIPTION OF THE DRAWINGS

For a more complete understanding, reference is now made to the following description taken in conjunction with the accompanying Drawings in which.

DETAILED DESCRIPTION

Figure 1:
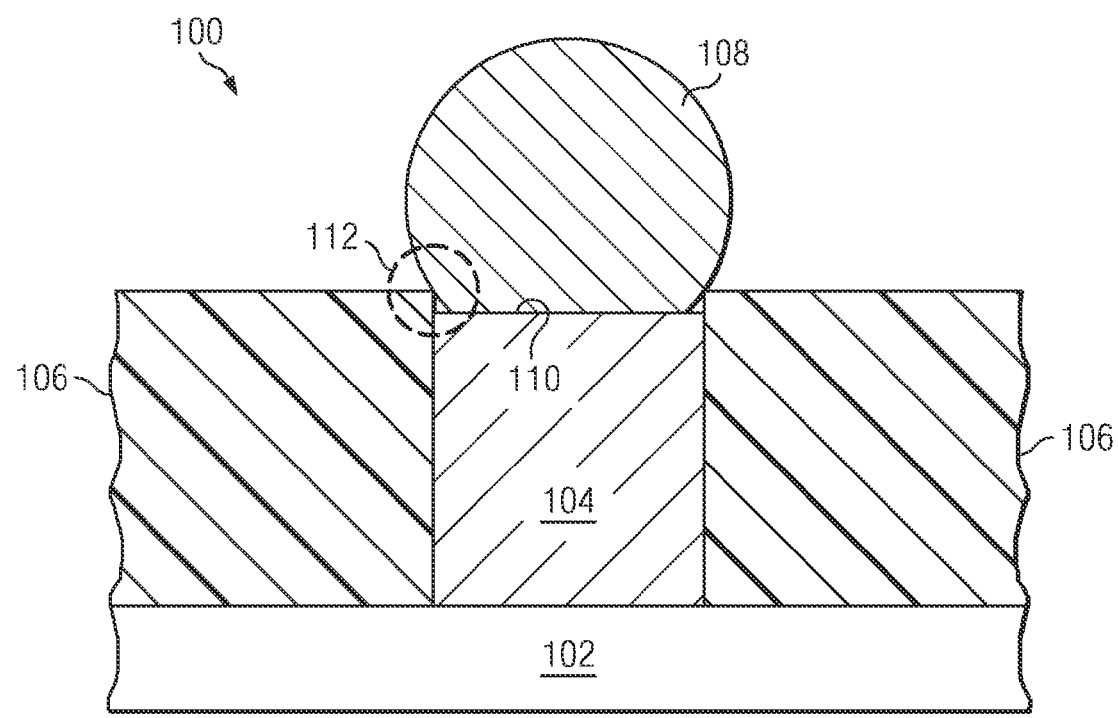
FIG. 1 illustrates a prior art WLP copper post-solder ball structure for interfacing with a circuit external to the prior art WLP.

Referring now to the drawings, wherein like reference numbers are used herein to designate like elements throughout, the various views and embodiments of an enhanced WLP for superior temp cycling, drop test and high current applications are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Figure 2:
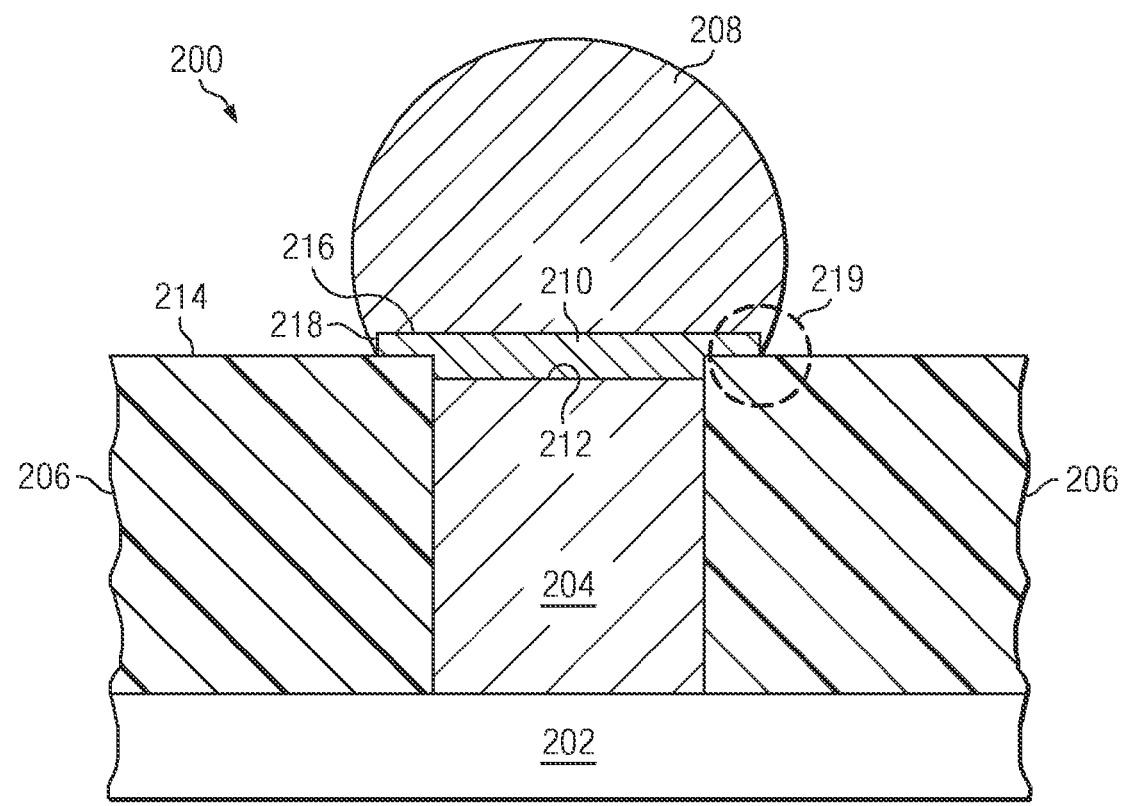
FIG. 2 illustrates an exemplary WLP copper post-solder ball structure for interfacing with a circuit external to the exemplary WLP.

Referring now to FIG. 2, an embodiment of the invention is disclosed as a WLP with an electrical plated Under Ball Metallurgy (UBM) copper post configuration 200. This exemplary UBM/copper post configuration 200 comprises a silicon wafer portion 202, which has integrated circuitry thereon (not specifically shown). A copper pillar or post 204 is attached to a predetermined location of a Redistribution Layer (RDL) layer (not specifically shown). The copper post or pillar 204 may be from about 30 to 130 microns long as it extends from the RDL layer away from the silicon wafer 202. An epoxy or encapsulant material 206 substantially covers the surface of the silicon wafer 202 (over the integrated circuitry and RDL) and surrounds the sides the copper post 204. The epoxy or encapsulant 206 as well as the copper post 204 may have succumbed to an upper surface 212, 214 surface grinding process whereby the copper post surface 212 and the epoxy surface 214 are ground and polished to be substantially level with each other. An etching process may take place that etches oxide (e.g., copper oxide) off the top 212 of the copper post 204 resulting in the copper post surface 212 being recessed or inset below the epoxy surface 214. An Under Ball Metal (UBM) 210 may be attached via electroplating or sputtering to the copper surface 212 of the copper post 204. The UBM 210 may be comprised primarily of silver, tin, 3 or 4 metal alloy solder, gold, nickel, palladium or tungsten. Furthermore, the UBM 210 will metallurgically bond with the copper post surface 212, fill the recessed or inset area above the copper post surface 212, and expand the cross-sectional diameter or width of the copper post by a predetermined amount such that the UBM layer overlaps a portion of the epoxy or encapsulant surface 214. The cross-sectional diameter or width of the overlapping (flanged) portion of the UBM will be 10 to 50 microns larger than the cross-sectional diameter or width of the copper pillar 204. In other words, the cross-sectional width or diameter of the UBM portion that is inset below the epoxy surface 214 is 10 to 50 microns smaller than the cross-sectional width or diameter of the UBM portion above or overlapping the epoxy surface 214.

A solder ball or solder bump 208 can then be reflowed and metallurgically attached onto the UBM 210 such that the solder ball is attached to the outer surface of the UBM and is also about the edges of the UBM sides 218. The overlap of the solder ball reflow about the UBM sides 218 is shown in FIG. 2 within the circle 219. By providing the UBM layer 210 on top of the recessed copper post surface 212, wherein the UBM layer extends from 5 to 25 microns above the epoxy/encapsulant surface 214, the solder ball is provided a three dimensional surface to metallurgically bond, grip and clamp to. That is, the solder ball 208 is not only bonded to the UBM upper surface 216 of the UBM 210, but also to the side surfaces 218 that overlap the epoxy surface 214. Additionally, since the UBM extends radially outward from the center of the copper post, like a flange, over the encapsulant surface 214, a stronger metallic bond is created between the solder ball-UBM-copper post metals. The resulting copper post and solder ball structure utilizes epoxy/encapsulant 206 in a manner that provides a mechanical robustness, which increases an exemplary WLP part's ability to pass temperature cycle tests and drop tests. Thus, embodiments of the invention exceed the temperature cycle and drop test performances of prior art devices, which did not incorporate the exemplary UBM layer between a copper post and a solder ball.

In various embodiments, the UBM layer may be electroplated, sputtered, electrolessly plated onto the copper post. Furthermore, an exemplary copper post 204 may be substantially cylindrical shaped, but may also be substantially pillar shaped with flat surfaces, grooves, spiral surfaces, textures or other surface structures about the sides of the pillar shaped copper post.

It is known that the metallic interface between tin-rich solder and copper is prone to electro-migration when electrical current is applied therethrough. Electron-Migration (EM) at an inter-metallic location can limit or prevent such an inter-metallic interface from being used in a high current application. Applicant has determined through experimentation that adding a thin nickel layer between the surface of a copper post 212 and the solder ball 208 decreases an inter-metallic compound (IMC) growth rate, which increases the electrical resistance of the inter-metallic interface. Applicant found that, by decreasing the IMC growth EM between copper and tin also substantially decreases the high current failure rate of the intermetallic interface. Thus, the addition of a nickel layer between the copper post and the solder ball has been shown to improve the current carrying capability of the inter-metallic compounds thereby making the electrical interconnection more useful at high current situations. Therefore, in some embodiments, the UBM 210 is made substantially of nickel.

Figure 3:
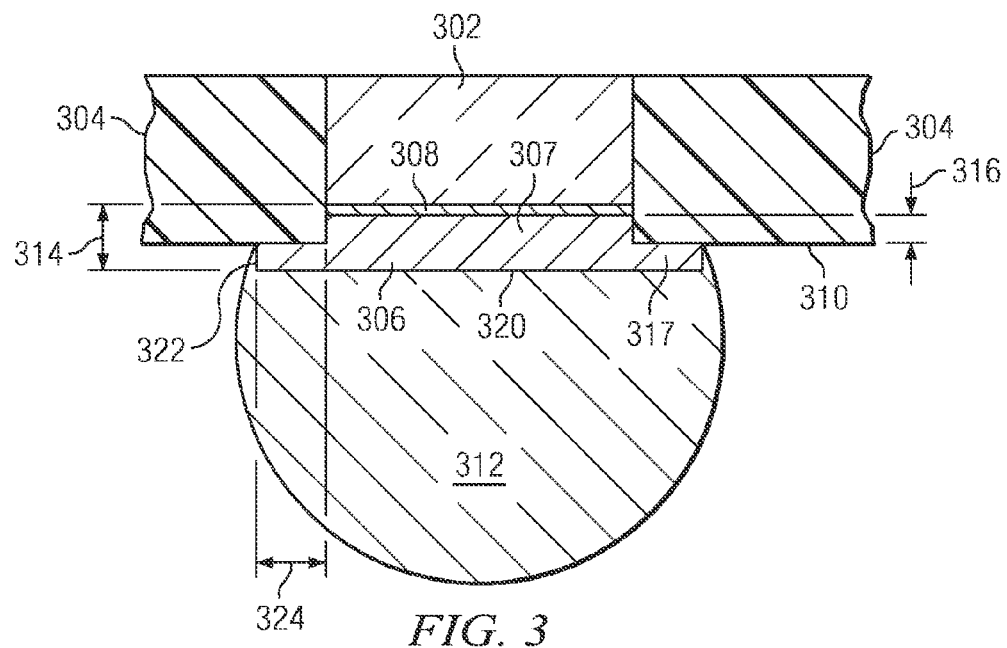
FIG. 3 illustrates an exemplary WLP copper post-solder ball structure having a nickel layer therein.

FIG. 3 depicts another embodiment of the invention comprising a thin nickel layer 308 between the copper post 302 and the UBM layer 306. The end portion of the copper post 302 is shown being surrounded by an epoxy or encapsulant substance 304. Between the copper post 302 and the UBM layer 306 is a thin layer of nickel 308. The thin layer of nickel 308 may have been sputtered, electroplated, electrolessly plated or chemically placed on the surface of the copper pillar 302 and between the copper pillar 302 and the UBM 306. The nickel layer, like the copper pillar 302 is recessed or inset from the outer surface of the epoxy 310. A UBM layer 306 is then placed on top of the nickel layer 308. The UBM layer fills the recessed area above the copper pillar in a first portion 307 and then forms a flanged portion 317 radially outward about the circumference of the copper pillar and over the surface of the epoxy 310. As shown in FIG. 3, the solder ball 312 when reflowed onto the UBM 306 enables the solder ball to "clamp" onto the protruding UBM 306 to form a more robust three dimensional mechanical attachment structure about the outermost top 320 and side surfaces 322 of the UBM 306. For example, the nickel layer 308 may have been placed on top of the copper pillar 302 via an electroless nickel plating process or an immersion AU (ENiG) process, which is done through a redox reaction. Such an exemplary structure for attaching solder bumps addresses the thermo mechanical phenomenon, known as solder fatigue, that may be partially responsible for sudden impact failures manifested in drop testing conditions of prior art wafer level package devices. Adding the nickel layer 308 with the UBM 306 provides a higher current carrying capability to the resulting exemplary copper pillar with encapsulant structure.

In additional embodiments of the invention, nickel may be added to the UBM metal thereby creating a metallic mix or alloy and thereby eliminate the additional step of placing or manufacturing the nickel layer 308 between a copper pillar 302 and the UBM 306.

In some embodiments, the nickel layer 308 is not used but instead the UBM layer 306 is made primarily of nickel or a nickel alloy. Furthermore, the UBM layer 306 could be other materials including, but not limited to, silver, tin, gold, palladium and tungsten or combinations thereof. The UBM overall thickness 314 may range from about 5 microns to about 30 microns. The thickness 314 of the UBM 306 would start from the copper post (or nickel layer 308) and extend away from the copper post such that the UBM's metal surface is above the surface 310 of the epoxy. The surface of the copper post may be recessed a distance 316 from about 1 to 15 microns down from the surface of the epoxy 310.

When the solder ball or solder bump 312 is attached or reflowed onto the exposed top and side surfaces 320, 322 of the UBM 306, the solder ball will not only bond to the surface 320 of the UBM, which is substantially parallel with the surface of the epoxy 310, but will also bond with the side surfaces 322 about the UBM. Thus, the solder ball will have a three dimensional metallic bond with the UBM (i.e., the large flat outer surface 320 of the UBM and the side surfaces 322 of the UBM that extend over the surface of the epoxy 310). The overlap portion or flange overlap 324 of the UBM that extends radially away from a circumference defined by the outer perimeter of the copper post circumference to the outer edge of the UBM layer on top of the epoxy surface 310 a radial distance of from 5 to about 30 microns. Thus, the flange overlap 324 may be from about 5 to 30 microns.

Figure 4:
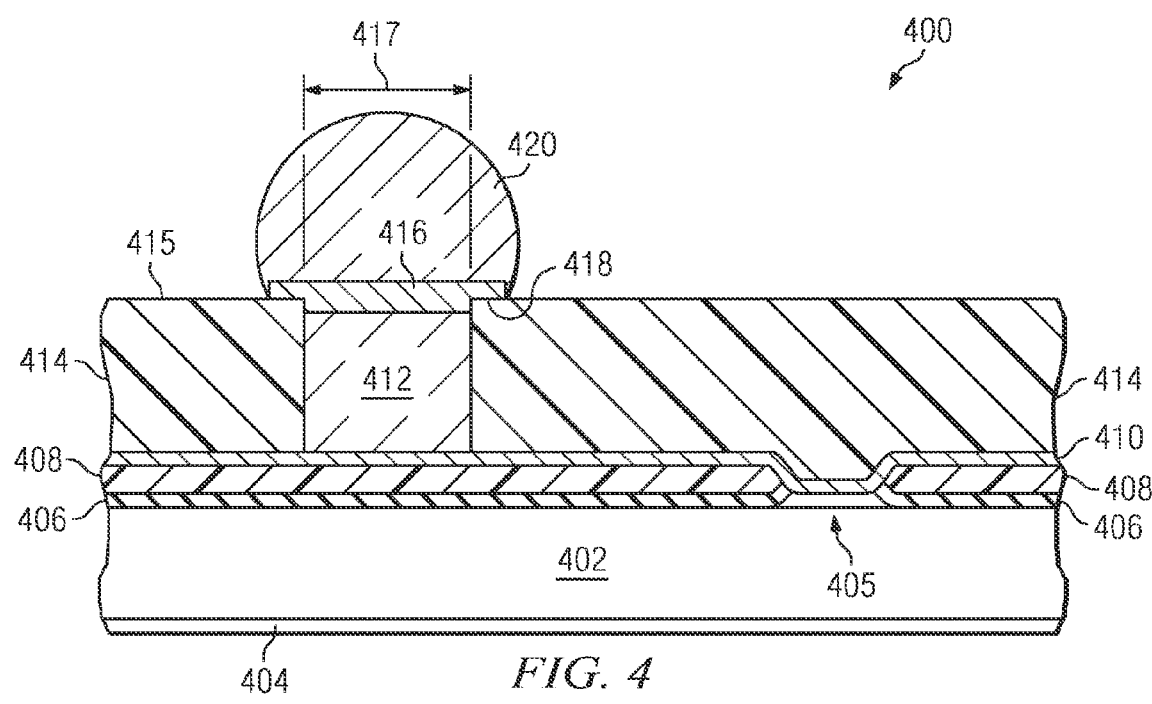
FIG. 4 illustrates another exemplary WLP copper post-solder ball structure in accordance with embodiments of the invention.

Referring now to FIG. 4, an additional embodiment of an exemplary WLP package with the copper pillar and UBM structure 400 is depicted. This exemplary WLP with a copper pillar and UBM structure 400 has a silicon wafer portion 402 wherein circuitry is etched and created in a fabrication process. A backside coating 404 may be placed on the back side or bottom of the silicon wafer 402 after the backside of the wafer has been ground down and/or polished to a predetermined thickness. On the circuit side or top side of the silicon 402 is a passivation layer 406, which covers the fabricated circuitry in the silicon. A WLP pad location 405 is provided to allow the fabricated circuitry on the silicon to be connected to circuitry that is external to the exemplary WLP. A polyimide, polymer or insulating layer 408 is placed on top of the passivation layer to insulate and protect the underlying fabricated silicon circuitry. On top of the polymer layer 408, redistribution layer (RDL) traces 410 are created so that electrical connections to circuitry external of the WLP can be distributed into predetermined organized positions. The redistribution layer 410 connects to the pad location 405 and extends in the direction toward the location of the ultimate exterior electrical connection for the WLP 400.

A copper pillar 412 is bonded and/or deposited in a predetermined location on top of the RDL 410. The copper pillar or post 412 may be from about 30 to about 90 microns in length extending from the RDL 410 away from the silicon 402. After the copper post(s) 412 are placed in their predetermined locations on the WLP package 400, an epoxy or encapsulant 414 is placed on and about the copper posts and cured. The top surface 415 of the epoxy 414 is then ground and polished such that the top surface of the epoxy 415 and the top of the copper pillar 412 are substantially in the same plane. At this time, an etching process may take place to etch an oxide layer and/or additional copper from the top surface of the copper pillar 412. The etching process may shorten the length of the copper pillar 412 such that its uppermost or top surface is recessed from the outer surface 415 of the epoxy. The uppermost surface of the copper pillar 412 may be recessed a distance of 1 to about 20 microns below the epoxy surface 415.

An exemplary Under Ball Metallurgy (UBM) layer 416 is deposited on to the upper surface of the copper pillar 412 to fill the recessed area and to extend the UBM structure above the epoxy top surface 415 and radially outward over or to overlap the top surface 415 of the epoxy a predetermined distance. The UBM layer may have a thickness of from a few microns to about 30 microns. The lower portion of the UBM layer 416 that is within the recessed area will have a diameter or width substantially similar to that of the copper pillar diameter or width 417. The exemplary UBM 416 will have an upper portion that is exterior to the recessed area. The upper portion has a diameter or width that is from 5 to about 60 microns larger in diameter than the copper pillar diameter 417. Thus, there will be an overlap 418 of the upper portion of the UBM layer over the top surface of the epoxy 415. The overlap 418 may be from about 2.5 microns to about 30 microns measured radially from the center of the UBM.

A solder ball or bump 420 can then be reflowed or attached to the metal surface and upper sides of the UBM upper portion thereby creating a three dimensional metallic attachment of the solder ball 420 to the upper surfaces of the UBM. The three dimensional metallic attachment of the UBM to the solder ball enhances the structural strength of a resulting exemplary WLP with the copper pillar and UBM structure 400 such that it withstands a larger number of drop tests than prior art devices before failure. Furthermore, the UBM 416, being comprised at least partially of nickel, provides enhanced current carrying capabilities and minimized electro-migration (EM). The overlap 418 of the UBM structurally strengthens the exemplary WLP copper pillar and UBM structure to withstand a larger number of temperature cycles than prior art WLP devices before failure. As such, an overall exemplary WLP with copper pillar and UBM structure 400 provides an enhanced WLP solder ball connection that provides superior temperature cycle, drop test reliability, and that supports higher current applications.

Referring now to FIGS. 2 and 4, an exemplary method of manufacturing an exemplary WLP that incorporates an exemplary copper pillar-flanged UBM-solder ball configuration is now described. Assuming first that an exemplary silicon wafer has been manufactured up to the point where the redistribution layer (RDL) layer (or seed metal layer) has been established, and further assuming that the locations of the copper pillars are known and predetermined, then a potential next step would be placing or distributing copper posts or pillars on the predetermined locations of the RDL. The copper posts or pillars may be from about 50 to about 90 microns in length. Each copper post length extends away from the top of the RDL or seed metal array thereunder. After the copper posts are deposited on the RDL layer (or seed metal), an epoxy is distributed to cover the copper posts, RDL layer (or seed metal) and the same-side surface of the wafer. The epoxy or encapsulant is solidified and cured. The encapsulant/copper post side of the wafer is ground and polished until the upper surface of the epoxy and the upper surface of the copper posts form a substantially planer surface. A next step is to etch the upper exposed surface of the copper posts to remove oxide that may have formed thereon and thereby create a good surface environment for electrical communication and metallic bonding with a next metal layer. The etching process will remove some of the upper surface of the copper posts such that the upper surface of the copper post will become recessed a distance of 3 to about 15 microns below the upper surface of the epoxy.

In a next step, an exemplary UBM layer will be established on the upper-recessed surface of the copper pillar. The UBM layer will fill the recessed area above the copper pillar and extend above the outer polished surface of the epoxy and about the recessed area forming a flange-like structure that overlaps the upper surface of the epoxy. The UBM layer may be deposited via electroplating, electroless plating, sputtering or even perhaps via a solder reflow process. The thickness of the UBM layer may be from about 5 to about 20 microns while its lower diameter inside the recessed area and adjacent to the copper pillar will be substantially the same as the diameter of the copper pillar and the upper UBM's diameter or width of the overlapping portion will be larger than the copper pillar diameter or width such that the upper overlapping portion extends radially from an extended circumference of the copper pillar to overlap the epoxy surface. The overlap over the epoxy surface may be from 3 to about 30 microns. Solder balls can be reflowed onto the upper surfaces of each UBM such that the solder balls interface with both upper and the side surfaces of the UBM layer. Individual WLP devices can then be cut from the overall wafer.

Figure 5:
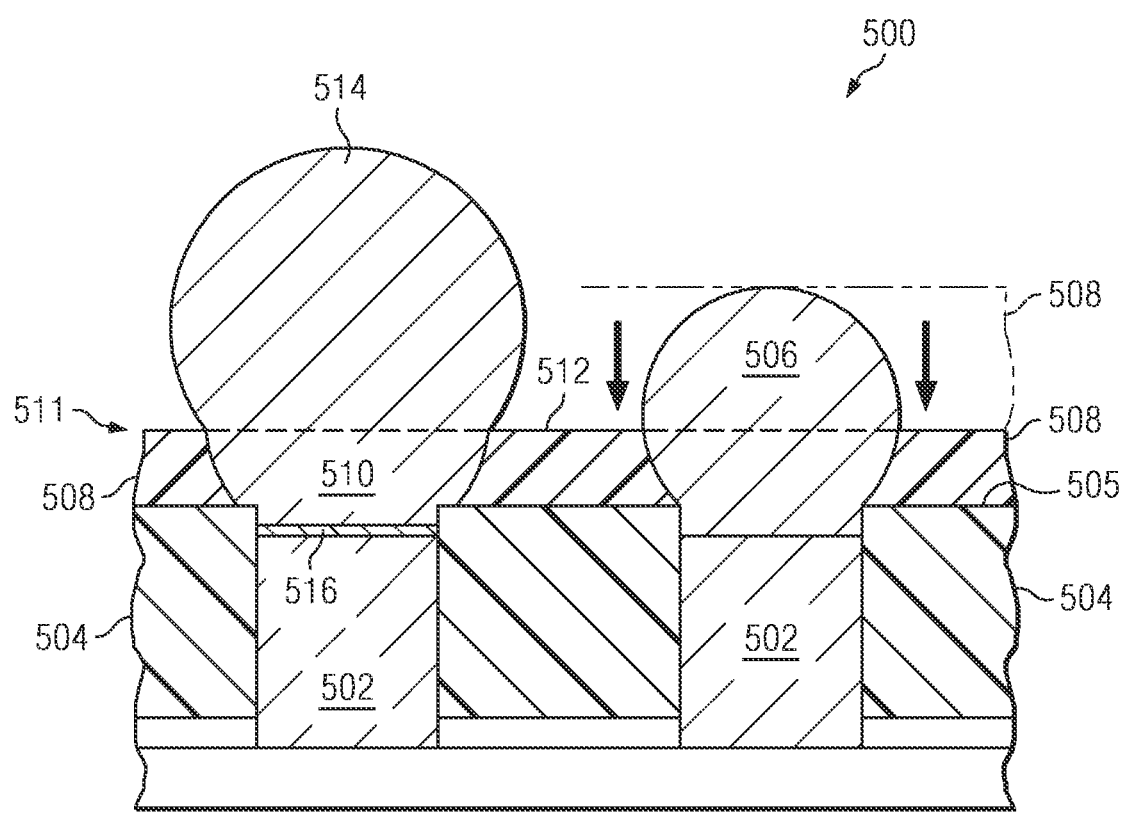
FIG. 5 illustrates another exemplary WLP copper post-solder ball structure with an embedded under metal/solder ball in accordance with embodiments of the inventions.

Referring now to FIG. 5, an additional embodiment of the invention is provided. FIG. 5 depicts an embedded solder ball, which may be used as a UBM structure and further enhances the temperature cycle and drop test survivability and reliability of a WLP part. Further, in certain embodiments, the current carrying potential of the WLP electrical connection may be enhanced when nickel is included among the exemplary embedded solder ball metallics. An exemplary WLP with copper pillar and embedded solder ball 500 comprises a copper post 502 that is positioned on a redistribution pad or location of an RDL or directly over a WLP pad associated with fabricated integrated circuitry on the silicon chip. The copper post 502 has a length that extends perpendicularly from the silicon surface. The copper post 502 is surrounded by a first epoxy or encapsulant 504. As with the previously discussed embodiment, the first epoxy or encapsulant 504 and the copper post 502 are ground and polished such that their top surfaces are substantially level and parallel to the silicon wafer. An etching process may be applied to the copper pillar 502 thereby removing a small amount of copper and oxide from the upper surface of the copper pillar 502 such that the resulting upper surface of the copper pillar 502 is recessed a distance from 3 to 20 microns below the upper surface 505 of the first epoxy layer 504. A first solder ball 506 is attached via, for example, a reflow process, to the upper surface of the copper post 502. The first solder ball 506 may comprise nickel as one of its metallic elements. The first solder ball 506 may be substantially tin, but include nickel and other metallics in it. In other embodiments, a thin nickel layer 516 may be deposited on the copper post 502 prior to adding the first solder ball 506.

After the first solder ball is metallurgically attached to the upper surface of the copper post 502, a second epoxy, encapsulant or substance 508 is placed over the solder ball 506. The second substance 508, in some embodiments, may be the same epoxy or encapsulant used in the first epoxy layer 504. In other embodiments, the second substance 508 may be an encapsulant or epoxy that, when cured and hardened, has a measure of elasticity or plasticity that is either greater or less than that of the first layer of epoxy 504. The second substance 508 along with the first solder ball 506 (the embedded solder ball) will have their surfaces ground and polished down to a predetermined level or thickness 511. This would result in an encapsulated partial solder ball 510 that is encapsulated in the remaining substance or second epoxy 508 such that both have upper surfaces 512 at a same level.

At this point in a manufacturing process, the encapsulated partial solder ball 510 is surrounded and structurally supported by the second epoxy or encapsulant substance 508. The encapsulated partial solder ball 510 may be considered a UBM.

A second solder ball 514 may then be reflowed and attached to the encapsulated partial solder ball 510 thereby creating a very strong metallic bond between the encapsulated partial solder ball 510 and the second solder ball 514. The embedded partial solder ball 510 is held in a structurally sound position via the second layer of encapsulant substance 508 such that embodiments of this WLP with copper pillar and an embedded solder ball 510 can withstand extended numbers of drop tests and temperature cycle sequences before failure. In some embodiments, nickel is added to the metallic of the first solder ball 506 to help increase the current carrying capabilities as well as the mechanical performance of this exemplary WLP copper pillar post configuration 500.

Again in some embodiments, a nickel layer 516 may be electroplated to the upper surface of the copper post 502 prior to reflowing the first solder ball 506 thereon. The nickel layer 516 will decrease the EM of the electrical connection between the first solder ball 506 (encapsulated partial solder ball 510) and the copper post 502. A decrease of the EM increases the current carrying capabilities of exemplary configurations 500.

A method for manufacturing the embedded solder ball copper pillar WLP embodiment 500 of FIG. 5 is now described. A wafer is manufactured and the copper posts extending perpendicular from the wafer's surface are attached on top of an RDL layer or a seed metal associated with a WLP pad. The copper posts or pillars may each be from about 30 to 90 microns in length with a predetermined circular cross-sectional shape thereby creating a cylindrical pillar or post. A next step, which may be optional, may be to electroplate a thin metal layer on the upper surface of each copper post. The metal layer may be a few microns to about 5 to 10 microns thick and may comprise a variety of metals including nickel, tin, gold, silver or various related alloys. An epoxy or encapsulant is placed on top and about the copper posts and the adjacent RDL and over the same side wafer surface. The epoxy or encapsulant completely covers the copper post and creates a layer thereover.

After the epoxy or encapsulant is cured and solidified, a grinding and polishing process takes place on the epoxy side of the wafer to grind the epoxy or encapsulant down to reveal a surface of each copper post or pillar. If an additional metal layer was placed on top of the copper post or pillar, then the top surface of the additional metal layer will be exposed. The grinding process may also remove some metal from the upper surface of the copper post or copper post/metal layer combination. After the epoxy surface is ground and polished, a chemical process may be used to etch oxide from the upper surface of the metal posts (either the upper surface of the copper post or the upper surface of the metal layer that was plated or sputtered onto the surface of the copper post). The etching process may recess the surface of the metal post down from the surface of the epoxy layer from 1 to about 15 microns. Next, a first solder bump is flowed (a flux may be used in the flow process to further remove oxide) onto the top of the metal posts. Each first solder bump will substantially fill the recessed area above the copper post that is below the surface layer of the first epoxy layer. Each first solder bump will create a substantially spherical solder ball on top of each copper post. A next step is filling the area around each first solder bump with a second filler material. The second filler material may be the same epoxy or encapsulant filler used in the first layer or it may be a different filler that will cure to be harder or be more plastic or pliable than the first layer of epoxy or encapsulant.

After the second layer of filler or encapsulant is cured and hardened, a second grinding and polishing process is used to grind the first solder bumps and the second epoxy layer down to a level of predetermined thickness. A desired thickness may range from about 20 to about 100 microns thick. At this point, the resulting structure comprises a ground-embedded solder bump portion 510 metallurgically attached to the metal post or pillar 502 (and perhaps 516). Furthermore, each ground solder ball acts like an Under Ball Metal (UBM) that is metallurgically attached to the top of the metal pillar or post. The ground first solder ball is embedded in the second layer of epoxy or encapsulant creating a structurally sound UBM portion for attaching a second solder ball or solder bump to.

A second solder bump is attached to the upper surface of the ground solder ball via a solder reflow process wherein the metals of the ground solder ball and the second solder ball may substantially intermingle thereby creating a strong metallic and electrical interconnection. Upon completion, the overall wafer may be cut into individual WLP devices.

Embodiments of this embedded solder ball copper pillar WLP process will produce a part having a stand off distance in the range of 100 microns to about 350 microns, wherein the standoff distance is the distance between the copper post surface and the farthest point on the 2nd solder ball. A high standoff distance has been shown to increase the temperature cycle test reliability of a part. Furthermore, since the first solder ball is ground and embedded in a second layer of epoxy as a UBM layer, the structural soundness of the resulting embodiment is more reliable when subjected to drop testing. Finally, if an additional metallic, such as nickel, is plated onto the upper surface of the copper post in between the copper post and the first solder ball (the ground embedded solder ball) the current carrying capabilities of the exemplary copper pillar connection will be greater than the current carrying capabilities of prior art WLP connections that do not include a nickel or barrier metal layer therein. Furthermore, the nickel layer minimizes or substantially eliminates the electro-migration problem that is known to interfere with the tin-solder and copper interfaces that over time prevents such interfaces and from being useful in high current applications.

Embodiments of the invention provide a UBM layer that is metallurgically attached to a copper post WLP configuration and that is partially over or on top of an epoxy surface, which surrounds each of the copper posts. The exemplary UBM layer results in an enhanced WLP that alleviates a stress point associated with prior art post/solder ball/epoxy interfaces 112 shown in FIG. 1. Incorporation of nickel between a solder ball and a copper post decreases the inter-metallic compound (IMC) growth rate. A decrease in an IMC growth rate results in improved current carrying capability in WLP solder ball-copper pillar connections. Furthermore, attaching a solder ball about a 3-D UBM which extends outside the surface of the epoxy layer results in a more robust and strengthened WLP intermetallic electrical interface structure. Also, in another UBM-type structure, an embedded ground solder ball provides an improved structurally sound electro-mechanically enhanced copper pillar interface for an exemplary WLP. Embodiments of the invention enhance WLP copper pillar electrical connection structures via an encapsulant structure, which incorporates a larger UBM, a UBM that extends above the surface of the epoxy layer, a flange shaped UBM structure, an embedded solder bump UBM structure and/or by adding nickel to or adjacent to the UBM or solder ball to enable a higher current carrying capacity and better thermo-electrical and mechanical performance to the overall exemplary WLP device.

It will be appreciated by those skilled in the art having the benefit of this disclosure that this enhanced WLP for superior temp cycling, drop test and high current applications provides a WLP device that has a copper post-flanged UBM-solder bump structure or a copper post-embedded UBM-solder bump structure that eliminates many of the mechanical and structural problems found in prior art WLP devices that do not incorporate an embodiment of the invention. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A wafer level package (WLP) bump structure comprising:
   a copper pillar extending perpendicularly a first distance from a fabricated WLP silicon surface, the copper pillar comprising pillar sides and a distal portion that is distal from the fabricated WLP silicon surface, the distal portion comprising a copper surface;
   an encapsulant about the pillar sides and substantially covering the fabricated WLP silicon surface, the copper surface being recessed a first recess distance below an encapsulant outer surface;

a layer of nickel metallurgically bonded to the copper surface, the layer of nickel having a nickel surface that is recessed a second recess distance below the encapsulant outer surface, the second recess distance less than the first recess distance, wherein a volume is defined between the nickel surface and the encapsulant outer surface; and an under ball metallic (UBM) metallurgically bonded to the nickel surface, the UBM comprising a first portion that occupies the volume between the nickel surface and the encapsulant outer surface and a second portion that extends beyond the encapsulant outer surface, covers the first portion of the UBM, and overlaps a portion of the encapsulant outer surface; and a solder ball attached to the second portion of the UBM, the solder ball overlapping an edge of the second portion of the UBM and contacting the encapsulant outer surface.

2. A wafer level package (WLP) comprising:

a fabricated silicon layer having a circuit side;

a circuit connection location on the circuit side;

a copper pillar having a length from a first end to a second end and a first width, the first end metallurgically bonded to the circuit connection location;

a layer of nickel having a first surface metallurgically bonded to the second end of the copper pillar and a second surface opposite the first surface;

an under ball metallurgy (UBM) layer comprising:
  a neck end having the first width and a neck length, the neck end set against the second surface of the layer of nickel; and
  a flange end having a second width and an edge thickness, the neck end centered with flange end, the neck end centered with the second end of the copper pillar, the first width being smaller than the second width;

an encapsulant layer about the copper pillar, substantially covering the circuit side and having an encapsulant thickness that extends from the circuit side to the flange end and an encapsulant outer surface, wherein the second surface of the layer of nickel is recessed below the encapsulant outer surface so that a volume is defined between the second surface and the encapsulant outer surface, wherein the neck end of the UBM is disposed within the volume, and wherein the flange end of the UBM extends over the volume and overlaps a portion of the encapsulant outer surface; and a solder ball set on the flange end, the solder ball overlapping an edge of the flange end and contacting the encapsulant outer surface.

3. The WLP of claim 2, wherein the flange end is rectangular.

4. A WLP comprising:

a WLP die comprising a circuit side;

a copper post comprising a post width and having a post length from a first post end to a second post end, the copper being attached at the first post end to a WLP circuit connection location on the circuit side;

a first metal layer comprising a flared portion having a narrow end and a wide end, the narrow end having a narrow width equal to the post width, the narrow end being set to and aligned with the second post end;

a layer of nickel having a first surface metallurgically bonded to the second post end of the copper pillar;

a first encapsulant layer substantially covering the circuit side, the copper post, the layer of nickel, and a portion of the narrow end of the first metal layer such that the narrow end is disposed within a volume defined between the layer of nickel and an outer surface of the first encapsulant layer, and the wide end extends over the volume and overlaps a portion of the outer surface of the first encapsulant layer; and a solder ball attached to the wide end of the first metal layer, the solder ball overlapping an edge of the wide end of the first metal layer and contacting the outer surface of the first encapsulant layer.

5. The WLP of claim 4, wherein the first metal layer's width is equal to the narrow width for a first length portion and is equal to a wide width for a second length portion.

* * * * *